(12) United States Patent
Bahl et al.

(10) Patent No.: US 7,353,442 B2
(45) Date of Patent: Apr. 1, 2008

(54) ON-CHIP AND AT-SPEED TESTER FOR TESTING AND CHARACTERIZATION OF DIFFERENT TYPES OF MEMORIES

(75) Inventors: Swapnil Bahl, New Delhi (IN); Balwant Singh, Greater Noida (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 89 days.

(21) Appl. No.: 11/102,556

(22) Filed: Apr. 8, 2005

(65) Prior Publication Data

US 2005/0246602 A1    Nov. 3, 2005

(30) Foreign Application Priority Data

Apr. 8, 2004   (IN) .......................... 695/DEL/2004

(51) Int. Cl.
  *G01R 31/28* (2006.01)
(52) U.S. Cl. ............... 714/733; 714/25; 714/30; 714/724; 714/718; 714/734; 714/737; 714/742; 365/201
(58) Field of Classification Search ............... None
  See application file for complete search history.

(56) References Cited

U.S. PATENT DOCUMENTS

| | | | |
|---|---|---|---|
| 5,961,653 A * | 10/1999 | Kalter et al. ............... 714/7 |
| 6,230,290 B1 | 5/2001 | Heidel et al. | |
| 6,321,320 B1 | 11/2001 | Fleischman et al. | |
| 6,347,056 B1 | 2/2002 | Ledford et al. | |
| 6,560,740 B1 * | 5/2003 | Zuraski et al. ............... 714/733 |
| 6,694,461 B1 * | 2/2004 | Treuer ......................... 714/719 |
| 6,728,916 B2 * | 4/2004 | Chen et al. ................... 714/733 |
| 6,760,865 B2 * | 7/2004 | Ledford et al. ............... 714/30 |
| 2002/0138802 A1 * | 9/2002 | Firth et al. ................... 714/733 |
| 2003/0120974 A1 * | 6/2003 | Adams et al. ................ 714/31 |
| 2004/0006729 A1 * | 1/2004 | Pendurkar .................... 714/733 |
| 2005/0257109 A1 * | 11/2005 | Averbuj et al. .............. 714/733 |

OTHER PUBLICATIONS

Fang et al., "Power-Constrained Embedded Memory BIST Architecture", Nov. 2003, IEEE Defect and Fault Tolerance Symposium, pp. 451-458.*
Fang et al., "Hardware/Software Co-Testing of Embedded Memories in Complex SoCs", Nov. 2003, ICCAD International Conference, pp. 599-605.*
Benso et al., "Programmable Bulit-In Self-Testing of Embedded RAM Clusters in System-on-Chip Architectures", Sep. 2003, IEEE Communications Magazine, pp. 90-97.*
Sakakibara et al., "A 750MHz 144Mb Cache DRAM LSI with Speed Scalable Design and Programmable at-Speed Function-Array BIST", 2003 Solid State Circuits Conference, IEEE, Digest of Technical Papers, pp. 458-608 vol. 1.*

* cited by examiner

*Primary Examiner*—John P Trimmings (57) ABSTRACT

An on-chip and at-speed tester for testing and characterization of different types of memories in an integrated circuit device, comprising a Centralized Flow Controller for automatically controlling the test operations for selected test programs, and Localized Signal Generators located inside each memory block and controlled by said Centralized Flow Controller for applying specified test patterns on the associated memory array.

20 Claims, 5 Drawing Sheets

ON-CHIP AND AT-SPEED TESTER FOR TESTING AND CHARACTERIZATION OF DIFFERENT TYPES OF MEMORIES

FIELD OF THE INVENTION

This invention relates to an on-chip and at-speed tester for testing and characterization of different types of memories. This methodology provides cheap and fast results.

BACKGROUND OF THE INVENTION

In present day circuits, memories play a vital role. Memories are verified thoroughly in their development phase before they enter into production phase. Memories are designed with less area and less marginalities to increase the speed and performance. So in the development phase, memories are much more prone to failures as compared to production phase. Hence proper methods for testing and debugging are very essential in the development phase.

In the development phase, memories are tested in all the conditions that they might face when used as a part of bigger system. Verification tests are designed such that they catch not only static defects but also dynamic defects. Static faults include defects such as stuck at, open circuit and short circuit faults. Dynamic faults include faults such as timing sensitive defects that may be due to weak pull-up or weak pull-down transistors. The number of patterns applied to validate the memory depends upon the size of memory and becomes very large for high capacity memories.

A specialized device tester is normally required to perform these tests on the circuit. All the patterns are loaded in the tester memory and tester runs them one by one. These patterns include read/write verification cycles designed in such a way that they sensitize the defects so that they can be caught. Relatively low cost and low speed device testers are usually used for detecting static faults. But these are not sufficient to detect dynamic faults in high-speed memories. For such high speed memories very expensive and high-speed testers are required. These expensive high-speed testers increase the overall cost of the devices.

Also, with the introduction of deep submicron and nanometer technologies, these needs have increased dramatically. The new technologies impact coupling and noise margins adversely and make integrating on-line test in modern integrated circuits mandatory.

Memories can be tested through an external device tester. Memories are accessed through I/O pads of the chip. The external tester applies extensive patterns on the memory. One such programmable memory test interface is disclosed in U.S. Pat. No. 5,968,192. The test interface includes logic circuitry configured to be integrated to a memory device. The memory device has a plurality of receiving connections that are configured to be coupled to a plurality of internal connections that couple to the logic circuitry. The interface further includes a plurality of programmable input pins and output pins leading to and from the logic circuitry, and the programmable input pins and output pins are configured to receive control signals from a test controller for operating the memory device in either a test mode or a mission mode. The programmable input pins and output pins are selectively interconnected to transform the logic circuitry into at least one type of memory testing methodology interface.

Built-In Self Test (BITS) circuits are another popular approach used for on-chip at speed testing of memories. Built-In Self Test (BITS) circuits have patterns/algorithms hard cored inside them. These patterns are applied on the memory at speed. Comparator inside the BITS monitors the response of the memory and generates pass/fail signal accordingly. The limitations of this approach are—Patterns other than hard corded cannot be applied.

Area of the BITS increases with increase in number of patterns.

BITS doesn't give much information about the cause of the failure.

They are inefficient for debugging process.

U.S. Pat. No. 6,230,290 discloses one such method of self-programmable Built In Self Test (BITS) for a memory (e.g., Dynamic Random Access Memory (DRAM)). The DRAM, which may be a DRAM chip, includes a DRAM core, a Microcode or Initial Command ROM, a BITS Engine, a Command Register and a Self-Program Circuit. During self test, the BITS engine may test the DRAM normally until an error is encountered. When an error is encountered, the Self-Program Circuit restarts the self test procedure at less stringent conditions. Optionally, when the DRAM tests error-free, the Self-Program Circuit may restart testing at more stringent conditions to determine DRAM functionality limits.

U.S. Pat. No. 6,321,320 elaborates a highly flexible and complex BITS engine provides at-speed access, testing, characterization, and monitoring of on-chip memory arrays, independent of other chip circuitry such as a CPU core. Each BITS engine has a main control block, at least one address generation block having an address local control block and one or more address-data generation blocks, and at least one data generation block having a data local control block and one or more data generation blocks. Each of the local address and data control blocks are programmed independently to define operations that will be performed by the individual address and data generation blocks, respectively. The main control block in turn controls operation of the local address and data control blocks to effect desired testing, accessing, and monitoring of the on-chip memory arrays.

U.S. Pat. No. 6,044,481 presents a programmable memory test interface for testing a memory device. The interface includes a plurality of programmable input pins and output pins. The interface also includes a logic interfacing means for connecting external signals to the plurality of programmable input pins and output pins. The external signals are processed by the logic interfacing means and then communicated to a plurality of memory connection pins that couple up to the memory device. The logic component means is capable of being configured in accordance with one or more memory testing methodologies including a serial built-in-self-test (BITS), a parallel built-in-self-test (BITS), a parallel test, a serial test, and a scan test. The configuring is performed by selectively interconnecting selected ones of the plurality of input pins and output pins to the external signals that drive the logic interface means in a test mode that operates in one or more memory testing methodologies or a mission mode.

The limitations of BITS circuits are—

Very expensive tester is required for testing.

Memories cannot be tested at speed because of low speed of I/O pads.

The tester memory, which stores the test pattern, limits the number of patterns.

Programmable BITS overcome the limitation of fixed patterns but their limitations are—

Difficulty in programming and usage.

Non-standard codes for operations. Non-standard way of programming the algorithms.

Generation of bits sequence for algorithm is manual.

Different types of memories have different types of controllers and hardware sharing is not possible.

Direct memory test and BITS don't help much for debugging memories. They can only help in finding if a particular pattern has run successfully or not. With the increase in overall manufacturing cost and difficulty in detecting at-speed tests, the demand for cost-effective and on-line testing has increased. In addition, there is a higher demand for on-chip characterization circuits, which accurately characterize the circuits thereby, helping greatly in debugging faulty IC's.

SUMMARY OF THE INVENTION

To address the above-discussed deficiencies of the prior art, the objects of the present invention is to provide on chip and at-speed tester for characterizing and debugging of different types of memories through a shared controller independent of number and type of memory, thereby saving hardware.

Another object of present invention is to provide a simple Test Program/Tester Setup to generate programmable test programs and algorithms based on micro codes.

Yet another object of present invention is to make the block silicon configurable and not design configurable hence saving lots of time in designing cycle.

Further object of present invention is to provide on-chip configurable and at-speed functional tests with programmable algorithm, port difference, address movements, start and end addresses, data stress.

Yet another object of present invention is to facilitate wafer level or board level testing.

Yet another object of present invention is to provide partitioning of hardware as different chips.

Yet another object of present invention is to provide hardware independent of DUT (Type/Size/topology/Numbers), Test Algorithm & Test Flow.

To achieve the said objectives this invention provides an on-chip and at-speed tester for testing and characterization of different types of memories in an integrated circuit device, comprising:

a Centralized Flow Controller for automatically controlling the test operations for selected test programs, and Localized Signal Generators located inside each memory block and controlled by said Centralized Flow Controller for applying specified test patterns on the associated memory array.

The said Centralized Flow Controller comprises:

a Centralized Processing Controller that implements the control sequence for each selected test and a standard interface for storing and accessing test and test configuration data;

a first test memory for storing test program defined in terms of micro codes;

a second test memory for storing memory test program details and parameters;

a third test memory for storing the test responses, and at least one other test memory for storing test algorithms.

The said Localized Signal Generator comprises:

a clock generator, and a signal generator to generate memory access signals in accordance with command signals received from said Centralized Flow Controller.

The said Centralized Processing Controller comprises of a number of interconnected state machines for executing the required flow and is shared between said test memories.

The said standard interface includes a serial and parallel interface.

The said first test memory, said second test memory and said one other test memory have write port externally controlled while read port is controlled through said Centralized Processing Controller.

The said third test memory has read port externally controlled while write port is controlled through said Centralized Processing Controller.

The said test program can be extended for more operation codes.

The said first test memory, said test second memory, said third test memory and said other test memory consists of fixed width but programmable length.

The said Centralized Processing Controller includes hardware or software that is configurable for different memory types.

The said tester is extended to Phase Lock Loops, Digital Signal Processors and Logic Blocks by customizing the said Localized Signal Generator and said Centralized Flow Controller.

A method for on-chip and at-speed testing and characterization of different types of memories in an integrated circuit device, comprising the steps of:

automatically controlling the test operations for selected test programs from the generated programmable test patterns and algorithms, and;

applying specified test patterns on the associated memory array.

The said programmable test patterns and algorithms are based on micro codes, which are silicon programmable.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "apparatus" and "controller" may be used interchangeably and mean any device, system or part thereof that controls at least one operation, such a device may be implemented in hardware, firmware or software, or some combination of at least two of the same. It should be noted that the functionality associated with any particular apparatus or controller may be centralized or distributed. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be described with reference to and as illustrated in the accompanying drawings, in which like reference numerals represent like parts, and in which.

DETAILED DESCRIPTION OF THE PRESENT INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

Figure 1:
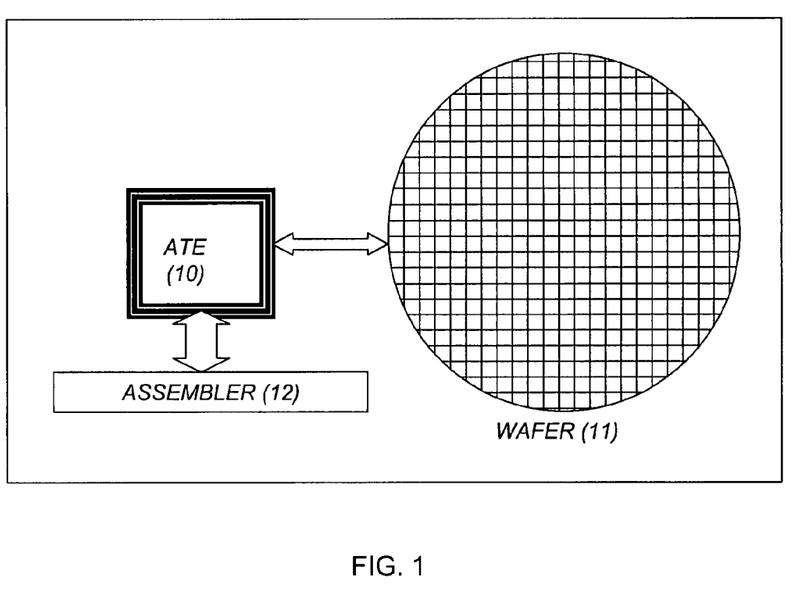
FIG. 1 shows the test setup.

The present invention relates to a cost effective testing, debugging and characterizing of memories. FIG. 1 presents the new test setup. Automatic Test Equipment (ATE) (10), which includes a low speed and low cost tester, is used for generating the patterns required to initialize the setup for the logic inside the chip. The function of ATE (10) here is not to generate large patterns for memory but to feed few bits of information inside the logic. It can be a low cost machine capable of feeding a pattern. The wafer (11) contains the chip containing the logic and memories to be tested. The memories can be tested at wafer level as well as package level. The assembler (12) is a software program, which gives an interactive and easy way to convert the patterns to be fed inside into the required bit stream. It also takes the output data from the ATE and converts the raw data into useful results, which can be interpreted by the user.

Figure 2:
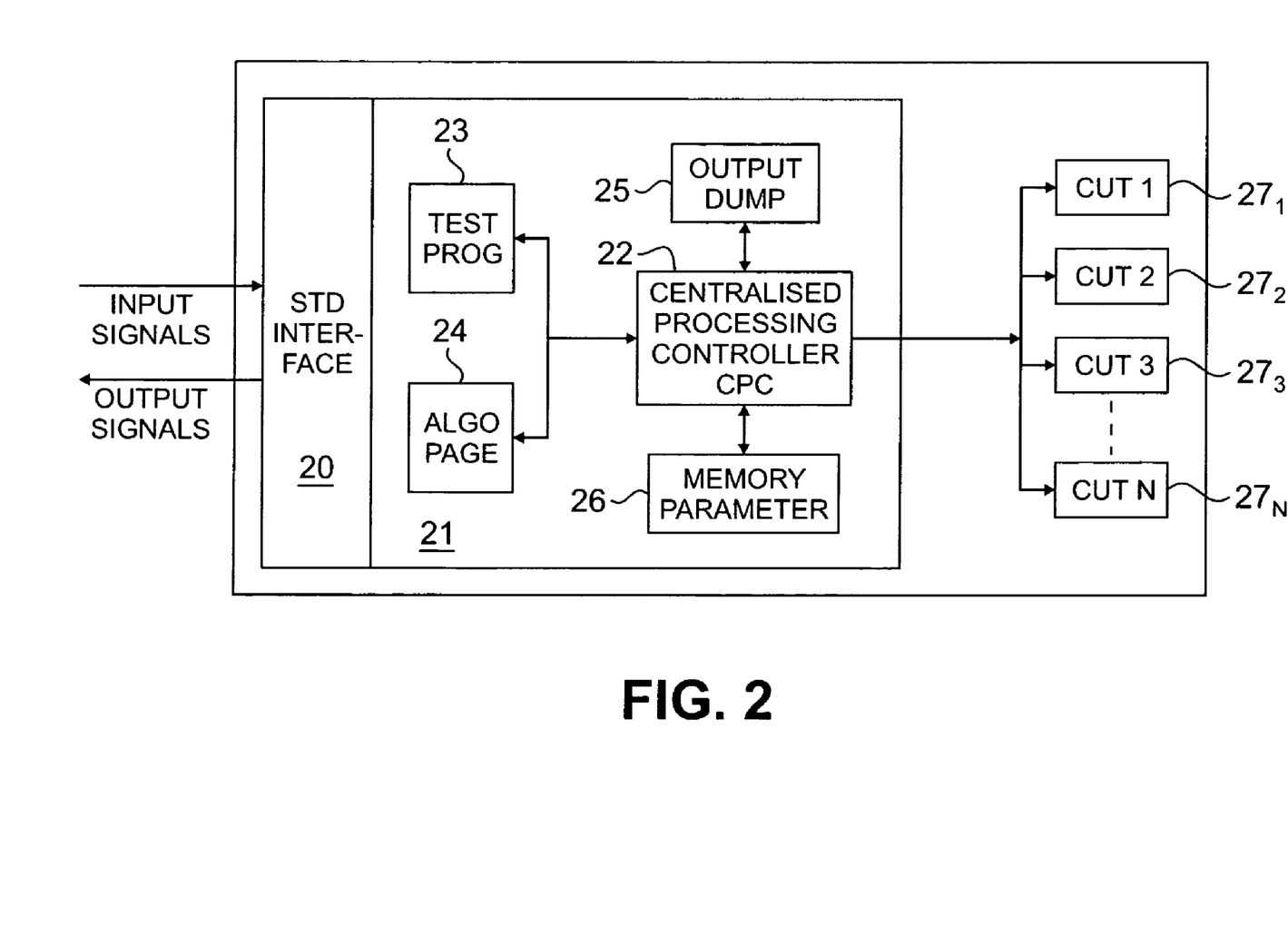
FIG. 2 shows the block diagram of the presented architecture.

FIG. 2 depicts the block diagram of various blocks of the proposed architecture. It comprises of a standard interface (20), a Centralized Flow Controller (CFC) (21), Centralized Processing Controller (CPC) (22), memory instances namely first test memory (23), second test memory (26), third test memory (25) and at least one other test memory (24) and cuts 27[1:N].

The said first, second, third and at least other test memory are also referred to test program (23), memory parameter file (26), output dump (25) and algorithm page (24).

A standard interface (20) is used to interface the hardware from the external world with the memories inside. It can be any standard test interface, for example TAP 1149. It provides an added advantage for diagnostics and access to internal registers.

The chip circuit mainly consists of two parts—Centralized Flow Controller (CFC) (21) and localized signal generator incorporated in each cut 27[1:N]. Centralized Flow Controller (CFC) (21) is a common programmable controller, which controls the required flow. It is required for at speed testing and accurate characterization of the memory incorporated in cuts (27[1:N]). The localized signal generator is generic and is independent of the memory type. Number of localized signal generators for a memory is equal to the number of memory ports.

The centralized flow controller (CFC) (21) again consists of a Centralized Processing Controller (CPC) (22) and a couple of memory instances (23, 24, 25 & 26). The CPC (22) is a programmable controller that consists of a number of interconnected state machines. The main role of CPC (22) is to implement the flow for each testing, debugging and characterization command. It generates the operation sequence in a defined logical manner, detailed in the latter part of the description. Apart from generating the sequence, it monitors the logic for failure. If the logic fails due to hardware fault or wrong software programming it tells the user about the failure. Centralized Processing Controller (CPC) (22) also interacts with the outside tester and localized signal generator collars through handshake signals. Handshake signals give a way to (CPC) (22) to interact with the outside world as well as with the internal independent controllers. The algorithms on which various flows work have a very high degree of overlapping, making hardware sharing possible. The flow for different testing and debugging commands are explained in detail in FIG. 5.

The memory instances (23, 24, 25 & 26) in CFC (21) are dual port SRAMS. These are soft memories, which are designed using standard cells, to provide greater reliability to the system. A Built-In Self Test circuit is also attached to these memories to provide self-testability feature. They are converted into first-in first-out memory using a wrapper. Width of each memory instance is fixed but the length can be changed during design time, depending upon the need.

The test program memory (23) is the first memory instance. This memory instance stores various instructions for a particular testing cycle. Its width is fixed to 9 bits and length can be fixed depending upon the required maximum number of commands to be run in a single cycle. The 9 bits width is further divided into 5 and 4 bits. Upper 5 bits support at maximum 32 commands and lower 4 bits support 4 options per command. The widths can be increased or decreased as per user's requirement of the number of commands and the number of options per command. The write port of test program memory (23) is controlled through the standard interface (20) but read port is controlled through CPC (22). Test program is written from outside through standard interface (20).

All the test program commands are flexible and can be changed according to the need. Also, similar commands can be added. Some of the test program commands are:

Initialization and Parameters update commands

Memory test commands

Memory debugging command

Memory characterization command.

Initialization and Parameters update commands:

1) END—End of test programme.
2) BACKGROUND—The 4 option bits tell the background on which march will work. To make complete data background bits, 4 bits are concatenated and stored in a data background register of width of maximum possible data bits. By using 4 bits, all the patterns, which are used for testing, 00 . . . 0, 11 . . . 1, 0101 . . . 01, 1010 . . . 10 etc can be applied. If the user wants a particular data background, which is not possible through 4 bits, then he has to write it directly on data background register using standard interface controller.
3) SELECT CUTS—This instruction selects the type of memories defined in 4 option bits. It reads the memory parameter store memory and matches the memory type and selects the memories of same type. This record is stored in a separate register, "memory selected". Memory selected register stores the information about the cuts which are selected by this instruction. All the following instructions before the next "select cuts" instruction run for the selected cuts.
4) APPLY STRESS—The 4 options bits are divided into two fields. Upper 2 bits are for address stress.
   00—No stress
   01—Invert row address
   10—Invert column address
   11—Invert both row and column addresses Lower 2 bits are for data stress.
  00—No stress
  01—Row stripe pattern
  10—Column stripe pattern
  11—Checkerboard pattern
5) LOAD WRITE PORT—Each 4 option field selects one write port.
6) LOAD READ PORT—Each 4 option field selects one read port. Hence a memory with up to 4 write and 4 read ports are supported. For supporting memory with more number of ports either more commands need to be introduced or option width is increased. By changing the selected ports an algo can be run from different ports.
7) PORT INCREMENT—This command decides the start and end address of the march for each port. The 4 option bits define the increment value for the selected ports by commands 'load write port' & 'load read port'. If different increment has to be assigned to different ports, then this command is run multiple times.
8) RESET ALGO POINTER—This command resets the FIFO pointer of algo page defined by 4 bits. This brings the pointer to the starting of first algo stored in that page.
9) ALGO DEPTH—This command skips algorithms before running a memory test/characterization/debug command. The 4 bits decides the number of algorithms to be skipped. Using this and 'reset algo pointer command', any algorithm in a page can be chosen.
10) REPEAT—This command repeats any operation on memory number of times as defined by 4 option bits.
11) LOOP—All the following commands run number of times as defined by the 4 option bits of this command. This command is used for analyzing soft errors.
12) JUMP—The number of following commands as defined by 4 bits, are skipped by this command.
13) SUSPEND—This commands suspends the system. This can be used for retention test of memory and for debugging the system.

Memory test commands:
14) RUN ALGO—This command runs one algorithm from the algo page defined by 4 bits on the selected cuts. The algorithm run from the selected page is defined by the pointer position. After running this command, the pointer will point to the starting of the next algorithm in the selected algo page.

Memory debugging command:
15) RUN BITMAP—This command calculates the full bitmap of the memory and stores in the output dump memory.

Memory characterization command:
16) CALC ACCESS TIME—This command calculates the minimum and maximum access time of the selected memory.
17) CALC SETUP/HOLD TIME—This command calculates the setup and hold time of the memory pins.
18) CALC MAX FREQ—This command calculates the maximum frequency of the memory.
19) CALC DISCHARGE RATE—This command calculates the minimum and maximum discharge rate for the memory.
20) CALC HIGH-LOW PERIOD—This command calculates the high and low period of the memory clock.

The second memory instance is called "memory parameter file" (26). This memory instance stores the information of all the memories in the system. Its width is fixed to (4+2*NOA), where NOA stands for maximum number of address bits in any memory. The length of this memory should be equal to maximum number of memory instances to be tested. The upper 4 bits are used to identify the type of the memory. With 4 bits, 15 different types of memories can be defined and one arrangement of 4 bits identifies "no memory". The write port of memory parameter store is controlled through a standard interface (20) but read port is controlled through CPC (22).

Upper 4 bits define the type of memory. Each memory of different type is assigned a different code. Code is not fixed but each memory of same type should be defined with the same code and same code should be used in 'Select cuts' command for selecting the memories. For example memories can be defined with following codes—

| | |
|---|---|
| 0000 | Single port read/write synchronous memory |
| 0001 | Dual port read/write synchronous memory |
| 0010 | Dual port, one read and one write port synchronous memory |
| 0011 | Synchronous FIFO memory |
| 0100 | Multiport 2 port read, 2 port write synchronous memory |

The 2*NOA bits, where NOA is maximum number of address bits, stores start and end address of the memory. By changing the start and end address value any region in the memory can be selected. This helps in concentrating on a region while debugging.

Third memory instance is called "Algo page memory" (24). This is actually a plurality of memory instances. With 4 bits option width of test program memory (23), at maximum 16 memory instances can be used. Each memory instance's width is of 3 bits and the length can be according to the requirement. All the algorithms in a single page are stored sequentially without any invalid code in between them. Number of Algo memory pages used is again dependent upon the requirement. Each algo page has an address, from 0 to 15, associated with it. The write ports of algo page memories (24) are controlled through standard interface (20) but read ports are controlled through CPC (22).

Algo page memory (24) consists of plurality of memory instances with width 3 bits. Maximum of 16 memory instances are supported. This is limited by test program option width. Length of each instance can be different and is independent of each other. Any number of algorithms can be stored in one algo page depending upon length of algorithms and algo page. It is advised to store algorithms for different types of memories in different instances.

Algorithm consists of number of marches and each march consists of address direction and a number of memory operations. Algorithms are coded using 3 bits in a following manner.

First code is for address movement. Following this, codes are written for memory operations till '000' code, which stands for march end.

Address movement codes can be—

| | |
|---|---|
| 000 | End of algorithm |
| 010 | Normal increment |
| 011 | Normal decrement |
| 100 | Column fast increment |
| 101 | Column fast decrement |
| 111 | Row fast increment |
| 110 | Row fast decrement |

Memory operation codes can be—

| | |
|---|---|
| 000 | End of march |
| 001 | End of march |
| 010 | Write 1 |
| 011 | Read 0 |
| 100 | Read 1 |
| 101 | Read without compare |
| 110 | No operation |
| 111 | Constraint |

'Constraint' operation is a special operation, which is used to activate the characterization circuit.

Fourth memory instance is called "Output dump memory" (25). It is used for dumping the result of each operation. Memory data is dumped out when all the operations have finished or when the memory is full. The write port of output dump memory is controlled through CPC (22) but read port is controlled through test interface controller.

Output dump memory (25) stores the response of each test/debug and characterization command. This helps in continuous flow of the test programme. When the test program ends, the memory data is flushed out and analysed.

Before starting the test, test program memory (23), algo pages (24) and memory parameter file (26) are filed with the required data. The data inside the memory is written through a standard test interface controller (20). The desired testflow is written inside test program memory (23). The required algorithms are written inside the algorithms pages (24). Algorithms can be written in one or more pages depending upon the number of algorithms, their individual lengths and lengths of algorithm pages. Algorithm is written in order of ports to be used for running the algorithm. Memory type and specifications are fed inside memory parameter file (26). After feeding the information, circuit is ready to generate the test patterns and store the responses.

Figure 3:
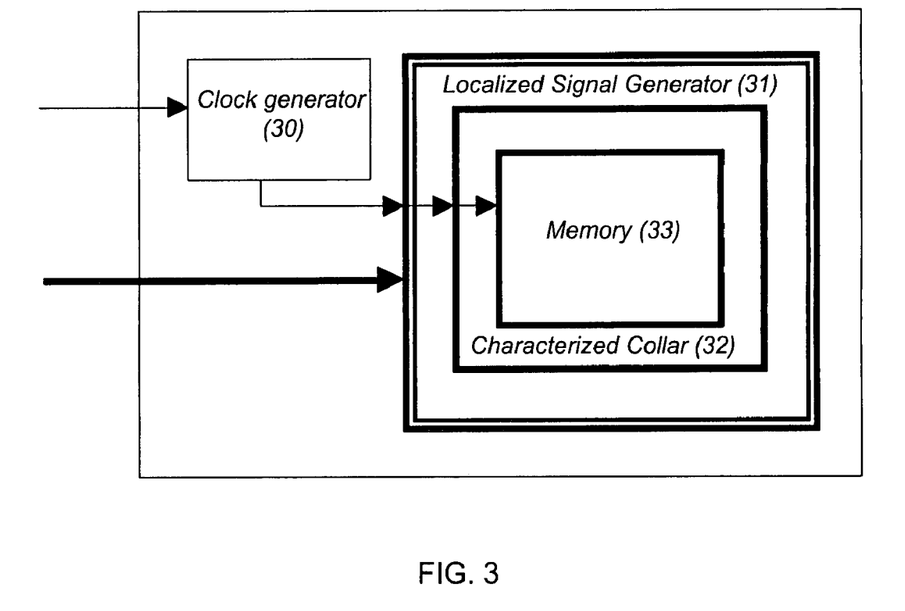
FIG. 3 shows the block diagram of 'DUT level' architecture.

FIG. 3 shows the DUT level block diagram. It gives the expanded view of cuts shown in FIG. 2. A clock generator (30) is used for testing memory at-speed. All the DUT level circuit works on the clock generated by clock generator (30). The complete DUT level circuit works on handshake signals generated by CFC (21). Characterization Circuit Collar (32) surrounds the memory (33), which is further surrounded by localized signal generator (31).

The localized signal generator (31) contains a memory, which stores the march operation in form of micro codes. The CFC (21) loads these codes before starting the localized signal generator (31). The localized signal generator (31) is a state machine capable of interpreting the codes and generating the required memory operation. The characterization circuit is enabled through localized signal generator (31).

Figure 4:
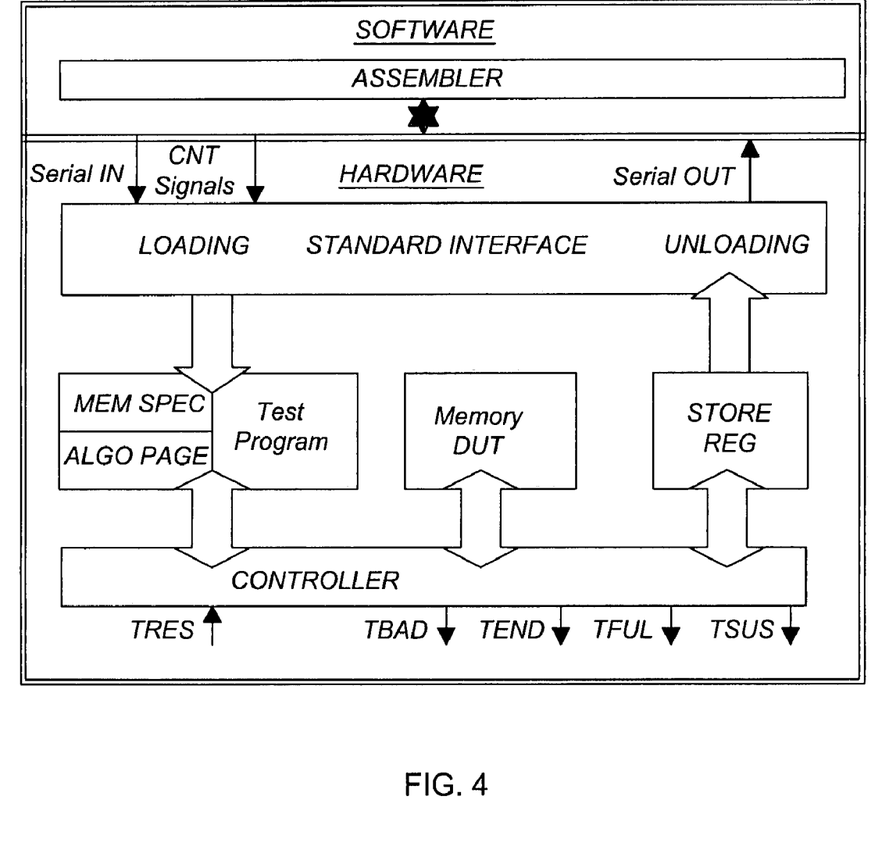
FIG. 4 shows the interface between different levels.

FIG. 4 expands various level of interface between hardware and software and inside the hardware. It also shows the extra input signal TRES and four outputs TBAD, TEND, TFUL and TSUS. These provide extra features for the flow.

Figure 5:
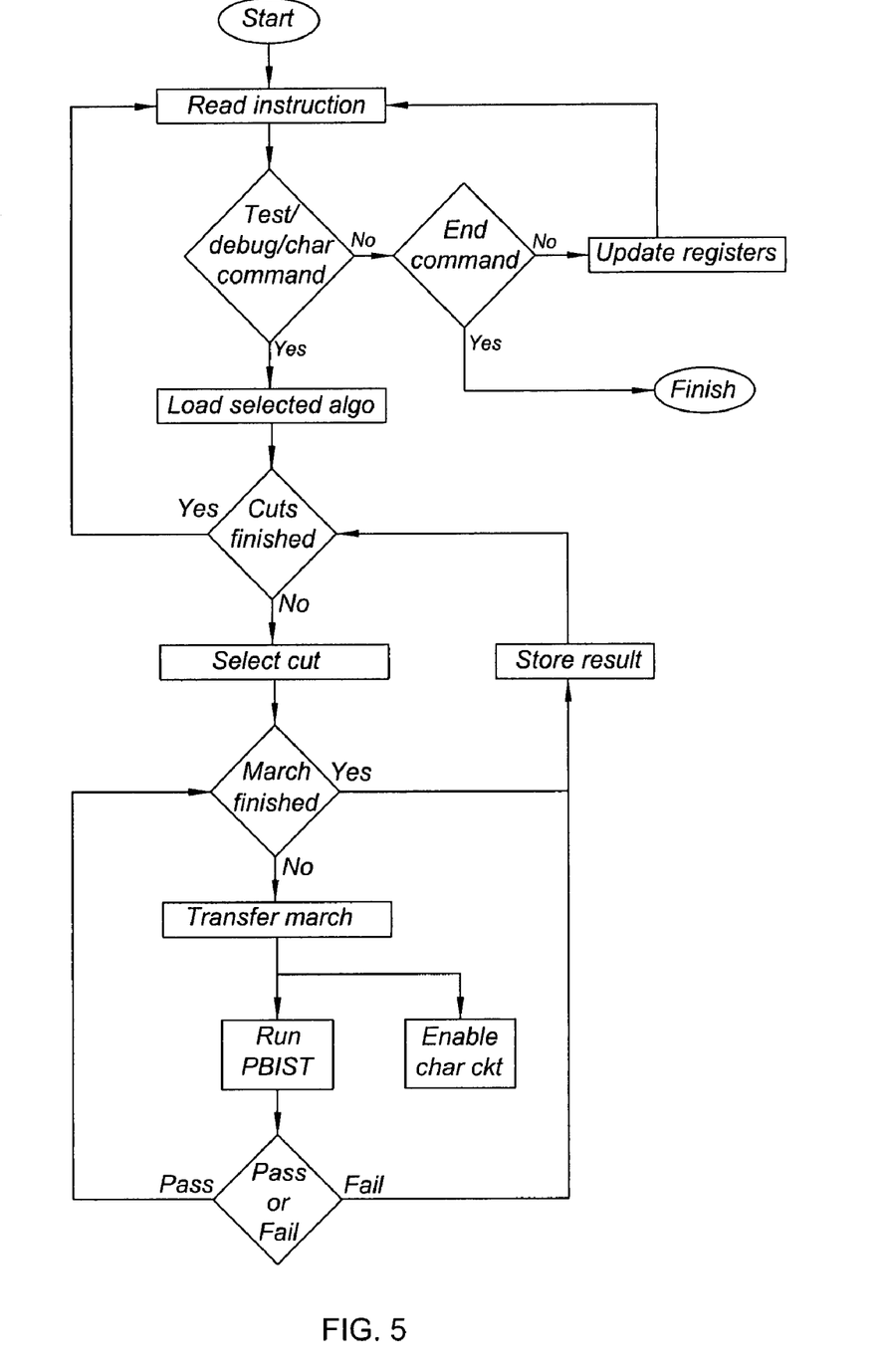
FIG. 5 shows the flowchart depicting the flow taken by the presented shared controller.

FIG. 5 shows the flowchart for the functional test run. The Central Processing Controller (22) fetches command from the test program memory (23) and takes certain actions according to the command. For non-test/debug/char commands, which don't require the BITS operation, certain registers are updated before the next command is fetched. For test/debug/char related commands first an algorithm is selected according to the selected algo page and its pointer position. This algorithm is transferred to a separate location so that it can be run multiple times. A cut is then selected among all the cuts 27[1:N] selected by 'Select Cuts' command. After selecting a cut, one march is transferred from the selected algorithm. The march is distributed according to the number of ports selected. The march is run using programmable BITS. If the command is of debug or char category, then the relevant circuit is also enabled. If the result of this march operation is 'bad', then the result is stored in output dump memory and the next cut is selected. Otherwise another march is transferred until all the marches have run. After running all the marches, the result is stored in the output memory and a new cut is selected. If all the cuts are over, then a new command is fetched. If the command is 'end' command, then TEND pin goes high.

We take an example to test a dual port memory of size 128×8, with the algorithm Write 0 from the first port on address locations 0 to 127 and then R0 from second port on address locations 127 to 0. The address of the memory on the chip is assumed to be 0.

Test program memory is fed with following commands:
'Load write port' 0001
'Load read port' 0001
'Select cuts' 0011
'Background' 0000
'Run algo' 0000
'End' 0001

Memory parameter file is fed with following commands:

| | |
|---|---|
| 0011 0000000000 0001111111 | // 0011 represent dual port memory and next 10 bits define start address and next 10 bits end address |
| 1111 xxxxxxxxxx xxxxxxxxxx | |

Algo page 0 is fed with following commands:
Normal increment
Write 0
No operation
End of march
No operation
Read 0
End of march
End of algorithm Data Unload Mode:

The data inside dump memory (25) contains the results of the executed commands. This data needs to be taken out to check the results. The data is flushed out from the memory using the standard test interface. If the memory gets full before the execution of all the commands, the output pin TFULL goes high and the CFC (21) goes into suspended state. The memory data is flushed out and the remaining operations are resumed by making high TRES pin high at least for one clock cycle.

Suspend Mode:

Centralized Flow Controller (21) enters in this mode when it executes 'SUSPEND' instruction. All the operations and flows are suspended. CFC (21) comes out of this mode when input pin TRES goes high. This mode can be used for data retention test.

System Error Mode:

Centralized Flow Controller (21) enters into this mode when there is a deviation from the normal flow. This can occur due to hardware failure or wrong software programming. When an error occurs, output pin TBAD goes high and the system suspends itself. User can analyse its cause after taking out internal signal and register values through scan chains.

The instant invention provides the flexibility of on the fly changes in test program and algorithm giving maximum tester slot utilization. Due to shared and Collar approach the over area is less. Due to CFC and Collar approach all the High Frequency Tests are possible through this architecture.

Advantages of the present invention

The proposed method provides a cost effective way for testing memories.

The proposed method uses a common shared controller and is independent of number and type of memory, thereby saving hardware.

The proposed method includes a controller, which could be hardware, or software that can be plugged in any integrated circuit to test the embedded memories.

With the proposed method, random access memory of any number of ports can be tested in a common way.

The block is silicon configurable and not design configurable hence time is saved in designing cycle.

The method is extendable for accommodating any new circuit for characterizing memory.

The process is extendable for testing any logic on the chip.

It is intended that the present invention encompass such changes and modifications as fall within the scope of the appended claims.

What is claimed is:

1. For use in testing an integrated circuit device comprising a memory-under-test and a localized signal generator, a testing apparatus comprising:
    a centralized flow controller having an interface to an external device, wherein the centralized flow controller is configured for communicating with the localized signal generator,
    wherein the centralized flow controller is configured for causing the localized signal generator to test the memory-under-test in accordance with a signal received from the external device via the interface, the signal indicating a memory type of the memory-under-test.

2. The testing apparatus of claim 1, wherein the centralized flow controller comprises:
    a centralized flow controller memory; and
    a centralized processing controller, coupled to the centralized flow controller memory,
    wherein the centralized processing controller, in accordance with a test program stored in the centralized flow controller memory, causes the localized signal generator to test the memory-under-test according to a test algorithm stored in the centralized flow controller memory and stores a result of the test in the centralized flow controller memory.

3. The testing apparatus of claim 2, wherein the centralized flow controller further comprises a standard interface coupled to the centralized flow controller memory and the centralized processing controller, wherein the standard interface is configured for
    writing the test program and the test algorithm into the centralized flow controller memory,
    causing the centralized processing controller to execute the test program, and
    reading the result from the centralized flow controller memory.

4. The testing apparatus of claim 1, wherein the integrated circuit device is one of a plurality of integrated circuit devices, each comprising a localized signal generator and a memory-under-test, and wherein the centralized flow controller is configured for communicating with each localized signal generator and causing each localized signal generator to test its associated memory-under-test.

5. The testing apparatus of claim 1, wherein the integrated circuit device is one of a phase lock loop and a digital signal processor.

6. A test system comprising:
    an integrated circuit comprising a memory-under-test and a localized signal generator; and
    a centralized flow controller having an interface to an external device, wherein the centralized flow controller is configured for communicating with the localized signal generator,
    wherein the centralized flow controller is configured for causing the localized signal generator to test the memory-under-test in accordance with a signal received from the external device via the interface, the signal indicating a memory type of the memory-under-test.

7. The test system of claim 6, wherein the centralized flow controller comprises:
    a centralized flow controller memory; and
    a centralized processing controller, coupled to the centralized flow controller memory,
    wherein the centralized processing controller, in accordance with a test program stored in the centralized flow controller memory, causes the localized signal generator to test the memory-under-test according to a test algorithm stored in the centralized flow controller memory and stores a result of the test in the centralized flow controller memory.

8. The test system of claim 7, wherein the centralized flow controller further comprises a standard interface coupled to the centralized flow controller memory and the centralized processing controller, wherein the standard interface is configured for
    writing the test program and the test algorithm into the centralized flow controller memory,
    causing the centralized processing controller to execute the test program, and
    reading the result from the centralized flow controller memory.

9. The test system of claim 6, wherein the integrated circuit device is one of a plurality of integrated circuit devices, each comprising a localized signal generator and a memory-under-test, and wherein the centralized flow controller is configured for communicating with each localized signal generator and causing each localized signal generator to test its associated memory-under-test.

10. The test system of claim 6, wherein the integrated circuit device is one of a phase lock loop amid a digital signal processor.

11. The test system of claim 6, wherein the integrated circuit device further comprises:
    a characterization circuit coupled to the memory and to the localized signal generator; and
    a clock generator coupled to the localized signal generator, the characterization circuit, and the memory,
    wherein the localized signal generator is configured for enabling the characterization circuit to characterize the memory.

12. A method of testing an integrated circuit device comprising a plurality of memories-under-test and a corresponding plurality of localized signal generators, comprising the steps of:
    receiving a signal indicating a memory type of each of the plurality of memories-under-test;

storing test operations in one or more of the plurality of localized signal generators according to the received signal; and causing the one or more localized signal generators to test their associated memories-under-test in accordance with the stored test operations.

13. The method of testing of claim 12, wherein the integrated circuit device further comprises a characterization circuit coupled to the memory-under-test and to the localized signal generator, the method further comprising the step of causing the localized signal generator to enable the characterization circuit to characterize the memory-under-test.

14. The method of testing of claim 12, further comprising the step of storing the results of the test in a memory for subsequent review.

15. A method of testing an integrated circuit device comprising a plurality of memories-under-test and an associated plurality of localized signal generators, comprising the steps of:

loading a test program, a plurality of algorithms, and an information file comprising information representing a type and specification of the plurality of memories-under-test;

testing one or more of the plurality of memories-under-test; and storing a result of the testing of the memories-under-test.

16. The method of testing of claim 15, wherein testing one or more of the plurality of memories-under-test further comprises the steps of:

fetching a command from the test program;

selecting an algorithm from the plurality of algorithms according to the command; and testing a memory-under-test according to the selected algorithm.

17. The method of testing of claim 16, wherein the selected algorithm comprises a plurality of marches and testing a memory-under-test according to the selected algorithm further comprises the steps of:

selecting an unused march of the plurality of marches;

transferring the selected march to the localized signal generator of the memory-under-test;

causing the localized signal generator to test the memory-under-test according to the selected march;

receiving a result of the test from the localized signal generator;

repeating the steps of selecting, transferring, causing and receiving until the memory-under-test fails the test or all marches have been used.

18. The method of testing of claim 15, wherein the information file comprises individual type and specification information for each of the plurality of memories-under-test.

19. The method of testing of claim 18, wherein testing one or more of the plurality of memories-under-test further comprises:

fetching a command from the test program, the command specifying a memory type; and according to information stored in the information file, testing memories-under-test having the specified memory type.

20. The method of testing of claim 15, further comprising:

receiving the test program, plurality of algorithms, and information file via an interface circuit; and transmitting the stored results of the testing of the memories-under-test via the interface circuit.

* * * * *

UNITED STATES PATENT AND TRADEMARK OFFICE
CERTIFICATE OF CORRECTION

PATENT NO. : 7,353,442 B2
APPLICATION NO. : 11/102556
DATED : April 1, 2008
INVENTOR(S) : Swapnil Bahl et al.

It is certified that error appears in the above-identified patent and that said Letters Patent is hereby corrected as shown below:

Column 1, line 64, delete "(BITS)" and replace with --(BIST)--;
Column 1, line 66, delete "(BITS)" and replace with --(BIST)--;
Column 2, line 1, delete "BITS" and replace with --BIST--;
Column 2, line 5, delete "BITS" and replace with --BIST--;
Column 2, line 7, delete "BITS" and replace with --BIST--;
Column 2, line 11, delete "(BITS)" and replace with --(BIST)--;
Column 2, line 14, delete "BITS" and replace with --BIST--;
Column 2, line 16, delete "BITS" and replace with --BIST--;
Column 2, line 24, delete "BITS" and replace with --BIST--;
Column 2, line 27, delete "BITS" and replace with --BIST--;
Column 2, line 49, delete "(BITS)" and replace with --(BIST)--;
Column 2, line 50, delete "(BITS)" and replace with --(BIST)--;
Column 2, line 56, delete "BITS" and replace with --BIST--;
Column 2, line 62, delete "BITS" and replace with --BIST--;
Column 3, line 3, delete "BITS" and replace with --BIST--;
Column 9, line 61, delete "BITS" and replace with --BIST--;
Column 10, line 4, delete "BITS" and replace with --BIST--; and
Column 12, claim 10, line 51, delete "amid" and replace with --and--.

Signed and Sealed this

Fifth Day of January, 2010

David J. Kappos
*Director of the United States Patent and Trademark Office*